United States Patent [19]
Hawthorne

[11] Patent Number: 5,896,651
[45] Date of Patent: Apr. 27, 1999

[54] METHOD OF MOUNTING MICROELECTRONIC CIRCUIT PACKAGE

[75] Inventor: Emily Hawthorne, Mountain View, Calif.

[73] Assignee: LSI Logic Corporation, Milpitas, Calif.

[21] Appl. No.: 08/713,174

[22] Filed: Sep. 12, 1996

Related U.S. Application Data

[62] Division of application No. 08/323,817, Oct. 17, 1994.

[51] Int. Cl.$^6$ ........................................... H05K 3/30
[52] U.S. Cl. ............................ 29/832; 29/827; 174/52.4
[58] Field of Search ............................ 29/827, 840, 832; 174/52.4

[56] References Cited

U.S. PATENT DOCUMENTS

| | | |
|---|---|---|
| 3,628,105 | 12/1971 | Sakai et al. . |
| 4,079,511 | 3/1978 | Grabbe ...................................... 29/827 |
| 4,089,575 | 5/1978 | Grabbe . |
| 4,658,330 | 4/1987 | Berg . |
| 4,658,331 | 4/1987 | Berg . |
| 4,673,967 | 6/1987 | Hingorany ......................... 174/52.4 X |
| 4,706,811 | 11/1987 | Jung et al. ......................... 174/52.4 X |
| 4,736,520 | 4/1988 | Morris ...................................... 29/827 |
| 4,796,078 | 1/1989 | Phelps, Jr. et al. ................. 174/52.4 X |
| 4,849,856 | 7/1989 | Funari et al. . |
| 4,873,615 | 10/1989 | Grabbe .............................. 174/52.4 X |

(List continued on next page.)

FOREIGN PATENT DOCUMENTS

| | | |
|---|---|---|
| 59-130453 | 7/1984 | Japan . |
| 1-14948 | 1/1989 | Japan . |
| 2-46673 | 2/1990 | Japan . |
| 2-205063 | 8/1990 | Japan . |

OTHER PUBLICATIONS

IBM Tech Disclosure Bull vol. 21 No. 5 Oct. 1978 p. 1817 by J.D. Larnerd et al.
IBM Tech Disclosure Bull vol. 28 No. 12 May 1986 pp. 5174–5175.

*Primary Examiner*—Carl J. Arbes

[57] ABSTRACT

A Tape-Automated-Bonding (TAB) package includes a resilient polyimide layer that supports a metal leadframe. A microelectronic circuit die is mounted in a hole in the polyimide layer and interconnected with inner leads of the leadframe. The TAB package is adhered to a support member having spacers that abut against the surface of a printed circuit board (PCB) on which the package is to be mounted and provide a predetermined spacing between the leadframe and the surface. Outer leads that protrude from the leadframe are bent into a shape so as extend, in their free state, toward the surface at least as far as the spacers. The package and support member assembly is placed on the PCB surface, and the combination of the weight of the assembly, the resilience of the leads and the preset standoff height enable the leads to resiliently deform so that the spacers abut against the surface and the leads conformably engage with the surface for soldering or other ohmic connection to conjugate bonding pads on the surface. The support member can be formed with lead retainers around which the leads extend to form loops that resiliently and conformably engage with the surface as the assembly is lowered thereon. The support member maintains coplanarity, adds weight to the package, pre-sets the standoff to protect the formed outer leads during surface mounting and enables the package to be shipped without a separate carrier.

29 Claims, 6 Drawing Sheets

U.S. PATENT DOCUMENTS

| | | |
|---|---|---|
| 4,885,126 | 12/1989 | Polonio . |
| 4,939,570 | 7/1990 | Bickford et al. . |
| 4,962,416 | 10/1990 | Jones et al. . |
| 5,045,921 | 9/1991 | Lin et al. . |
| 5,065,282 | 11/1991 | Polonio . |
| 5,072,283 | 12/1991 | Bolger . |
| 5,106,784 | 4/1992 | Bednarz ................................. 29/827 |
| 5,184,211 | 2/1993 | Fox . |
| 5,200,364 | 4/1993 | Loh ........................................ 29/827 |
| 5,254,871 | 10/1993 | Benavides et al. . |
| 5,263,242 | 11/1993 | Singh Deo et al. ............... 174/52.4 X |
| 5,278,724 | 1/1994 | Angulas et al. . |
| 5,358,904 | 10/1994 | Murakami et al. ...................... 29/827 |
| 5,378,657 | 1/1995 | Lin ........................................... 29/827 |
| 5,410,451 | 4/1995 | Hawthorne et al. . |
| 5,418,189 | 5/1995 | Heinen .................................... 29/827 |
| 5,471,097 | 11/1995 | Shibata . |
| 5,528,458 | 6/1996 | Yasuho et al. . |
| 5,568,363 | 10/1996 | Kitahara . |
| 5,673,479 | 10/1997 | Hawthorne . |

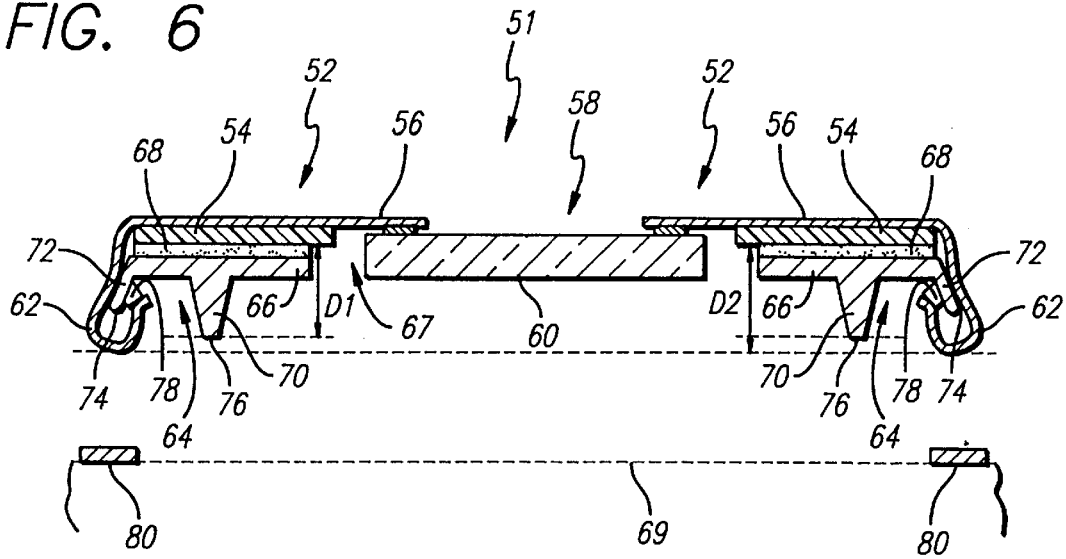
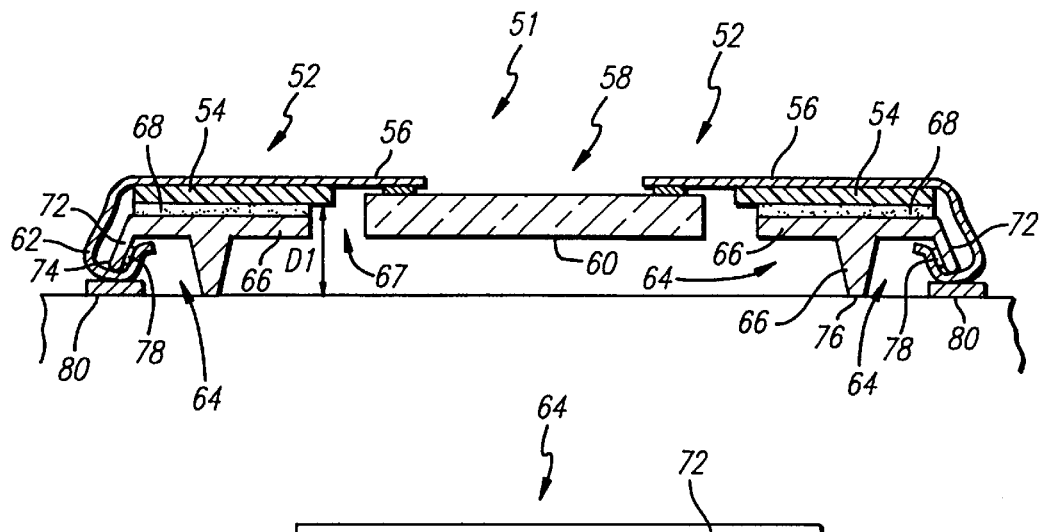
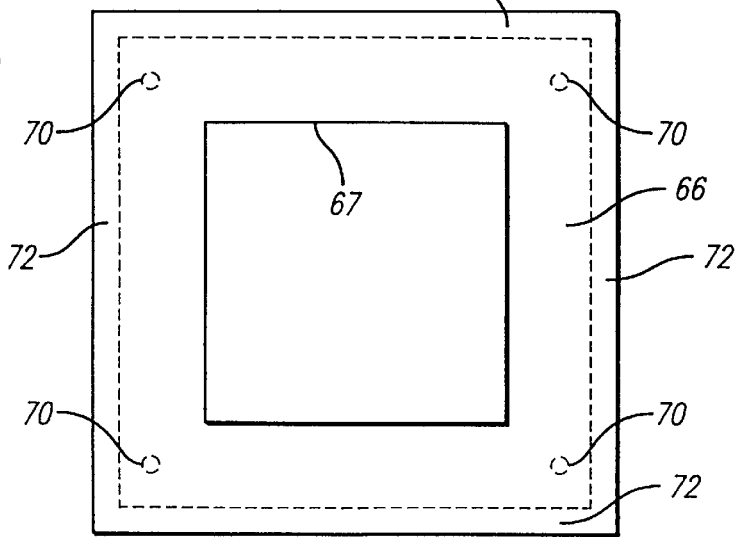

METHOD OF MOUNTING MICROELECTRONIC CIRCUIT PACKAGE

CROSS-REFERENCE TO RELATED APPLICATION

This is a divisional of copending application Ser. No. 08/323,817, filed Oct. 17, 1994.

BACKGROUND OF THE INVENTION

1. Field of the Invention

The present invention generally relates to the art of microelectronic circuit fabrication, and more specifically to a microelectronic circuit leadframe package such as a Tape-Automated-Bonding (TAB) package including integral support members for outer lead form protection during mounting on a printed circuit board.

2. Description of the Related Art

Tape-Automated-Bonding (TAB), also known as Chip-on-Tape (COT), is a system for assembling, shipping and mounting microelectronic circuit chips or dies that are integrally attached and interconnected to a flexible leadframe. TAB enables a large number of chip/leadframe modules to be automatically fabricated with high speed and precision in an economical manner.

The TAB system fabricates a large number of identical leadframe metallization patterns on a roll of polyimide tape that is movable between reels through the required processing stations. The individual patterns are cut from the roll to form leadframe packages. Microelectronic integrated circuit dies are mounted on the packages and interconnected with the leadframes, and the resulting TAB/COT modules are inserted into individual plastic carriers for shipping to end users.

A typical COT 10 is illustrated in FIG. 1, and comprises a flexible polyimide sheet or film 12 that is formed with peripheral perforations 14 to enable reel-to-reel transport of the roll from which the film 12 was cut using a sprocket (not shown). The film 12 is formed with a central hole 16 for receiving a microelectronic circuit die or chip 18.

The COT 10 further comprises a leadframe 20 that is formed on the film 12 as a metallization pattern. The leadframe 20 includes a plurality of leads 22 that extend laterally outward from bonding pads or terminals 24 (see FIG. 3) on the chip 18 to test pads 26 that are located adjacent to the periphery of the film 12. Each lead 22 includes an inner portion 22a that extends from the chip 18 to the edge of the hole 16, an intermediate portion 22b that extends under an optional protective epoxy layer 28, an outer portion 22c and a peripheral portion 22d that interconnects with the respective test pad 26.

The film 12 is further formed with excise apertures or holes 30 through which the outer portions 22c of the leads 22 extend. After the COT 10 has been received by the end user, it is tested using the test pads 26. The COT 10 is then subjected to further processing including excising the inner portion of the leadframe 20 and the chip 18 from the film 12. This is performed by severing the outer portions 22c of the leads 22 at the outer edges of the holes 30, and cutting webs 32 that connect the portion of the film 12 laterally inward of the holes 30 from the remainder of the film 12.

A module 34 that results from the excise step is illustrated in FIG. 2, and consists of the leadframe 20 with the peripheral portions 22d of the leads 22 removed, and the chip 18. The outer portions 22c of the leads 22 are redesignated as 36.

Although only a few leads are shown in FIGS. 1 and 2 for clarity of illustration, the leadframe 20 of an actual COT 10 includes a much larger number of leads, typically hundreds, that are spaced from each other by a pitch of less than 100 micrometers. The outer leads 36 as viewed in FIG. 2 are extremely thin and fragile, and can be easily deformed and/or damaged.

For this reason, the COT 10 cannot be handled or shipped in the configuration illustrated in FIG. 2 with the leads 36 free. It is necessary to maintain the COT 10 in the form illustrated in FIG. 1 until it is to be mounted on a printed circuit board (PCB) or other surface, including providing a protective carrier in which the COT 10 is retained for shipping. The carrier is necessarily larger and weighs more than the COT 10. This introduces increased shipping charges, in addition to the cost of the carrier itself.

Some leadframe packages have leads that are sufficiently large and strong that they can be bent into a conventional "gull-wing" or other suitable shape and provide sufficient rigidity for unsupported mounting on a PCB. The thin leads of the COT 10, however, are not able to support the weight of the assembly 34, and will collapse if an attempt is made to surface mount the module 34 of FIG. 2 in this manner.

For this reason, the COT 10 is conventionally mounted on a PCB 38 or other supporting surface formed with conjugate bonding pads or terminals 40 using a "hot bar" process as illustrated in FIG. 3. The COT 10 is moved to an excise station, while remaining in its protective carrier, where the leadframe 20 and chip 18 are removed from the outer portion of the film 12 and picked up by a vacuum arm. During this excise operation, the leads 36 are bent into a gull-wing shape as illustrated in the drawing.

The module 34, as excised from the COT 10 and having the leads formed into the gull-wing shape, is then placed by the arm 42 onto the PCB 38 with the leads 36 in contact with the terminals 40. A hot bar 44 presses the leads 36 against the terminals 40 and causes solder that was previously coated on the terminals 40 to reflow and ohmically adhere the leads 36 to the terminals 40.

Although capable of providing the required function of TAB mounting, the hot bar apparatus is expensive and slow, and is therefore impractical for small scale users to acquire. In addition, the conventional system for packaging, shipping and mounting COTs suffers from other drawbacks and disadvantages.

Due to the fragility of the outer leads, reworking of mounted COTs to correct, for example, defective solder joints is impractical. Removal of defective COTs after mounting is also difficult, since the fragile leads are easily broken and can remain attached to the PCB. It is also excessively difficult to test a COT after it has been excised from the package as illustrated in FIG. 1 and assumes the form illustrated in FIG. 2 due to the small size, extreme flexibility and fragility of the leads 36.

SUMMARY OF THE INVENTION

The present invention provides an improved Tape-Automated-Bonding (TAB) or Chip-on-Tape (COT) microelectronic circuit leadframe package structure including integral support members for outer lead protection and mounting, and a method for mounting the package on a printed circuit board (PCB) or other surface.

In accordance with the present invention, a TAB package includes a resilient polyimide layer that supports a metal leadframe. A microelectronic circuit die is mounted in a hole in the polyimide layer and interconnected with inner leads of the leadframe.

The TAB package is adhered to a support member having spacers that abut against the surface of a PCB on which the package is to be mounted and provide a predetermined spacing between the leadframe and the surface.

Outer leads that protrude from the leadframe are bent into a shape so as extend, in their free state, toward the surface at least as far as the spacers. The package and support member (spacer) assembly is placed on the PCB surface, and the weight of the assembly in combination with the resilience of the leads and their formed shape enables the leads to resiliently deform so that the spacers abut against the surface and the leads conformably engage with the surface for soldering or other ohmic connection to conjugate bonding pads on the surface.

The support member can be formed with lead retainers around which the leads extend to form loops that resiliently and conformably engage with the surface as the assembly is lowered thereon.

The support member protects the outer leads, and enables the present structure to be shipped without a separate carrier. The increased integrity that is imparted to the outer leads by the support member enables the structure to be electronically tested after it has been received by an end user. Reworking after mounting is also possible due to the increased lead integrity.

The present structure can also be surface mounted without the use of a hot bar apparatus. This provides TAB/COT capability to small scale users who do not have sufficient resources to acquire a hot bar apparatus. It also allows TAB/COT package to be surface mounted in the same manner as other peripherally leaded devices.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 6 is a sectional view illustrating another microelectronic circuit package according to a variation on the present invention prior to mounting on a printed circuit board or other surface;

FIG. 7 is similar to FIG. 6, but illustrates the structure after mounting on the printed circuit board;

FIG. 8 is a plan view illustrating a support member of the microelectronic circuit structure illustrated in FIGS. 6 and 7;

DETAILED DESCRIPTION OF THE INVENTION

Figure 4:
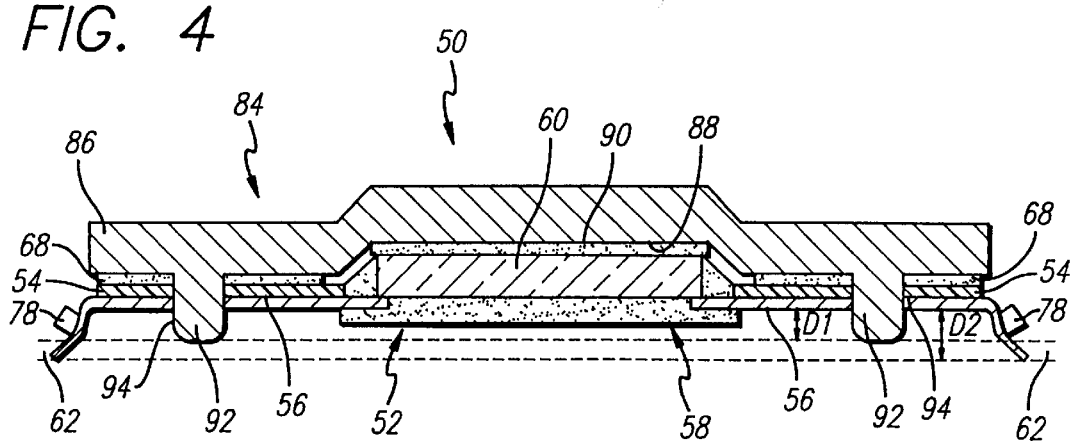
FIG. 4 is a sectional view illustrating a microelectronic circuit package according to the present invention prior to mounting on a printed circuit board or other surface.
Figure 5:
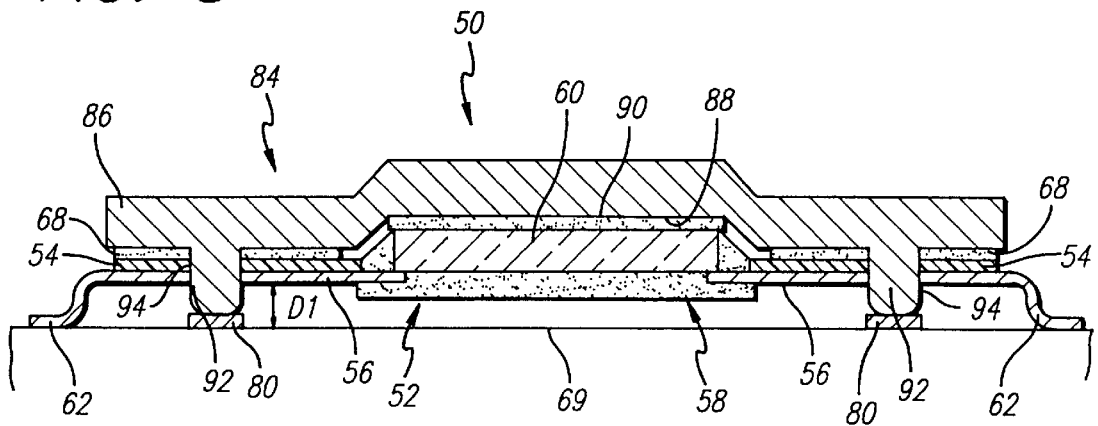
FIG. 5 is similar to FIG. 4, but illustrates the present structure after mounting on the printed circuit board.

A preferred embodiment of a microelectronic integrated circuit structure 50 according to the present invention is illustrated in FIGS. 4 and 5. The structure 50 comprises a Tape-Automated-Bonding (TAB) or Chip-on-Tape (COT) lead frame 52, which comprises a flexible polyimide sheet or film 54. A metallization pattern comprising a plurality of electrically conductive leads 56 is formed on the film 54.

Figure 1:
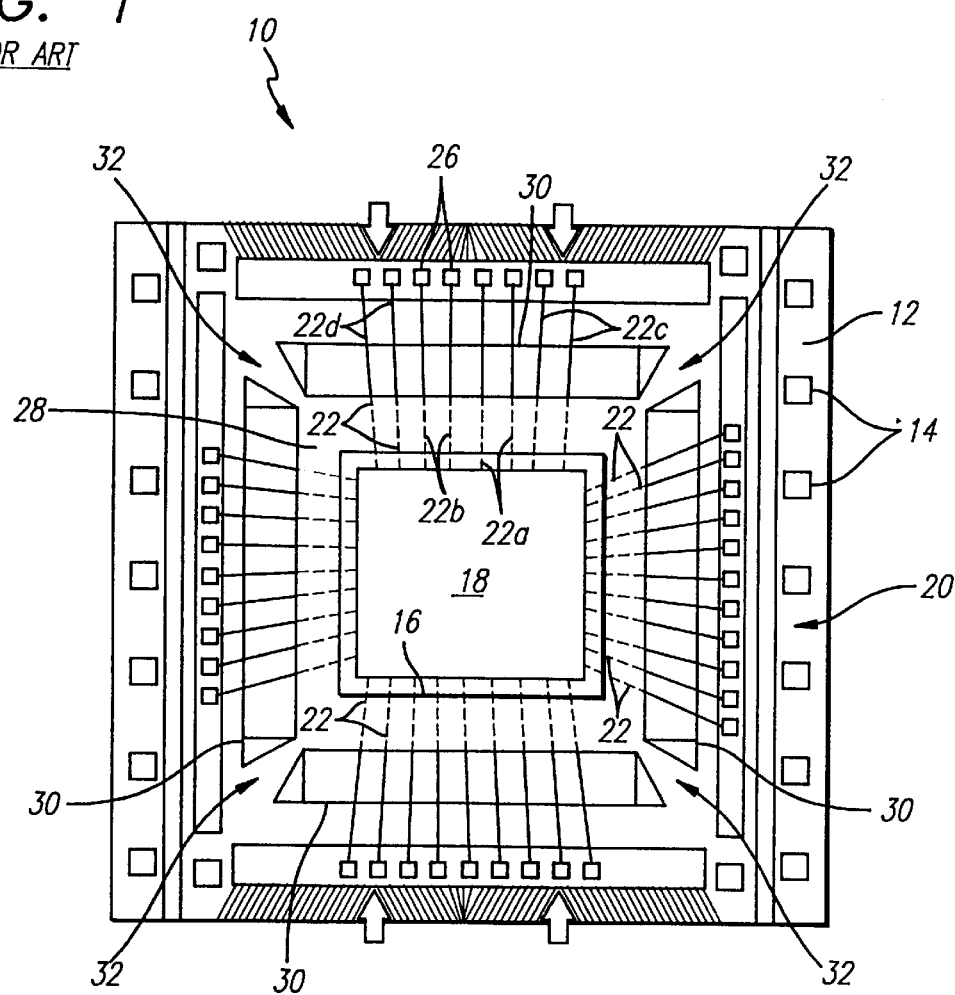
FIG. 1 is a plan view illustrating a conventional Tape-Automated-Bonding (TAB) or Chip-on-Tape (COT) microelectronic circuit package with an integrated circuit die or chip mounted thereon.
Figure 2:
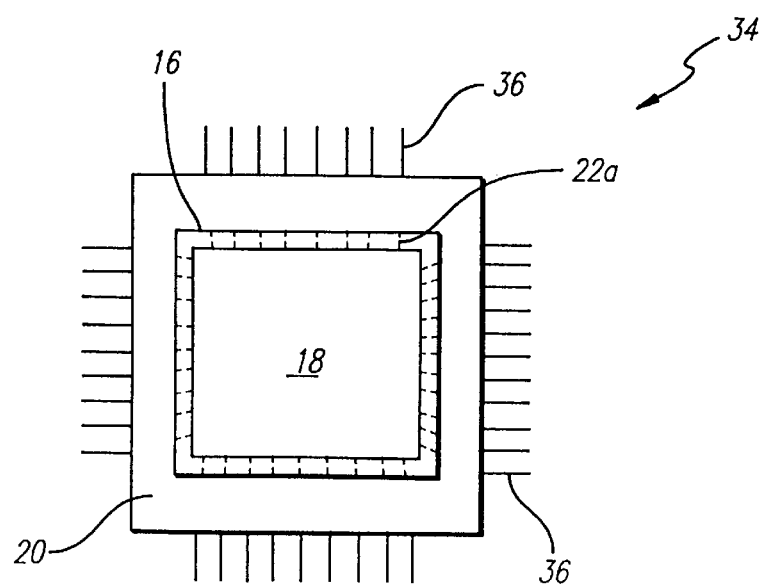
FIG. 2 is a plan view illustrating a lead frame assembly of the TAB illustrated in FIG. 1, with the microelectronic circuit chip mounted thereon, after excise from the TAB.

The lead frame 52 per se is essentially similar to the leadframe 20 illustrated in FIG. 1. The film 54 is formed with a central hole 58. Inner ends of the leads 56 extend over the hole 58, and are soldered or otherwise ohmically adhered to conjugate terminals on a microelectronic integrated circuit die or chip 60. In this manner, the chip 60 is supported by the lead frame 52 and electrically interconnected therewith. The leads 56 extend laterally outward from the film 54 to constitute outer leads that are redesignated as 62.

The structure 50 comprises a heatspreader 84 including a body 86 on which the leadframe 52 is adhered by means such as an adhesive 68, with the leadframe 52 being disposed between the support member 84 and a surface 69 of a printed circuit board (PCB) or other member on which the structure 50 is to be mounted as illustrated in FIG. 5. The heatspreader 84 is preferably stamped from a thermally conductive material that has the required physical properties and weight, and is formed with a cavity 88.

The chip 60 is adhered to the upper wall of the cavity 88 by a thermally conductive adhesive 90. Spacers 92 extend from the body 86 toward the surface 69 through holes 94 formed through the leadframe 52 in areas where the leads 62 are not present.

The ends of the leads 62 are bent into a gull-wing or other suitable shape with a positive toe angle such that the ends of the leads 62 are spaced from the leadframe 52 by a distance D2 in their free state as illustrated in FIG. 4. The distance D2 is equal to or larger than a distance D1 between the leadframe 52 and the ends of the spacers 92.

When the structure 50 is placed on the surface 69 for mounting, the leads 62 resiliently deform in such a manner as to conformably engage with bonding pads or terminals 80 on the surface 69 as illustrated in FIG. 5. The structure 50 is permanently attached to the surface 69 by applying heat such that solder (not shown) which was previously coated on the terminals 80 reflows and ohmically adheres the leads 62 to the terminals 80.

The weight of the heatspreader 84 is selected such that, in response to the total weight of the structure 50 and the resilience of the leads 62 and their formed shape, the leads 62 resiliently deform as the structure 50 is lowered onto the surface 69, and the ends of the spacers 92 abut against the surface 69.

Figure 3:
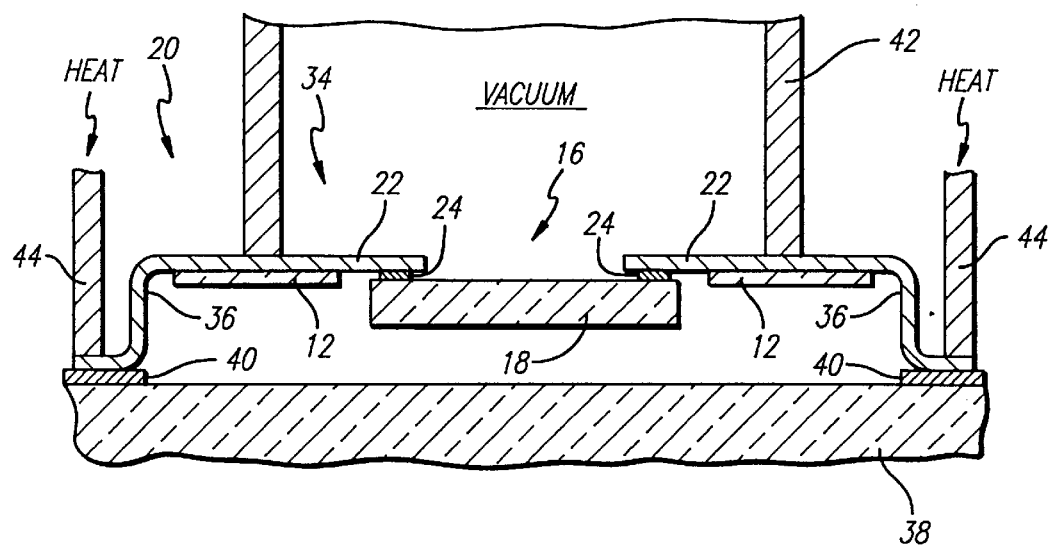
FIG. 3 is a sectional view illustrating a conventional "hot bar" process for mounting a TAB package on a printed circuit board.

This enables the structure 50 to be mounted without the use of a hot bar as is required in the prior art (see FIG. 3), since the spacers 92 render the structure 50 self-supporting. The spacers 92 provide the optimal spacing between the leadframe 52 and the surface 69, while the leads 62 are allowed to resiliently conform to the surface 69.

If desired, optional lead bars 78 of an electrically insulative material such as polyimide can be attached to the leads 62 as illustrated. The lead bars 78 can also be advantageously be provided outside (beyond) the lead tips, although not explicitly shown. The illustrated arrangement including the heatspreader 84 is especially advantageous in that the heatspreader 84 provides, in addition to its primary function of outer lead form protection during mounting, a secondary function of dissipating heat generated during operation of the chip 60.

In the above description, it was assumed that the thickness of the terminals 80 was negligible. If the terminals 80 have significant thickness, the distance D2 between the ends of the leads 62 and the leadframe 52 can be reduced accordingly in order to provide the required resilience for the leads 62. It will be noted that the resilience of the leads 62 provides the additional advantage of compensating for relative thermal expansion of the leads 62 and the terminals 80 during solder reflow.

The structure 50 is also adaptable to a configuration in which the ends of the leads 62 are designed to be nominally coplanar with the ends of the spacers 92, such that D2=D1. However, due to manufacturing tolerances, some of the leads 62 will protrude beyond the ends of the spacers 92 such that D2>D1. In such a case, the leads 62 that extend beyond the spacers 92 are capable of being resiliently deformed as described above to maintain coplanarity of the leads 62 and the surface 69.

In this variation, some of the leads 62 can also extend toward the surface 69 by a distance that is less than that of the spacers 92, such that D2<D1. In this case, the resulting gap is filled by the solder that is used to ohmically adhere the leads 62 to the terminals 80.

An alternative microelectronic integrated circuit structure 51 embodying the present invention is illustrated in FIGS. 6 to 8, in which like elements are designated by the same reference numerals used in FIGS. 4 and 5. The structure 51 comprises a support member 64 including a base 66 on which the leadframe 52 is adhered by means such as an adhesive 68. The base 64 is formed with a central hole 67.

The support member 64 is preferably injection molded from a thermally conductive and electrically insulative material such as polyphenyl sulfide (PFS), although the invention is not limited to any particular material. The support member 64 can be formed of any suitable material that has the required physical properties and weight.

Whereas the leadframe 52 is disposed between the support member (heatspreader) 84 and the surface 69 in the structure 50, the support member 64 is disposed between the leadframe 52 and the surface in the structure 51.

The support member 64 comprises one or more spacers 70 that extend away from the base 66 and the leadframe 52 toward the surface 69. The spacers 70 are illustrated as being embodied as elongated pins or rods, although the scope of the invention is not so limited.

The structure 51 further comprises a lead retainer 72 in the form of a peripheral, outwardly slanting edge that extends from the base 54 toward the surface 69. The retainer 72 has an end 74 that faces the surface 69. The spacers 70 have ends 76 that similarly face the surface 69. The distance from the ends 76 to the leadframe 52 are D1 as described above with reference to the structure 50 of FIGS. 4 and 5, whereas the distance from the end 74 to the leadframe 52 is less than D1.

Figure 9:
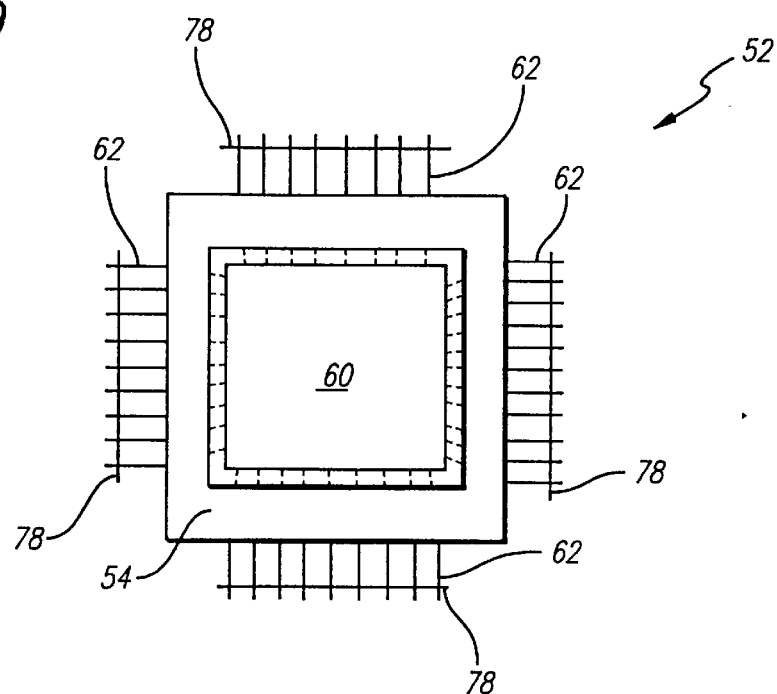
FIG. 9 is a plan view illustrating a lead frame package assembly, including outer leads that are retained by optional lead bars.

The outer leads 62 are bent inwardly around the laterally outer surface and the end 74 of the lead retainer 72. As further illustrated in FIG. 9, lead bars 78 of an electrically insulative material such as polyimide are adhered to the end portions of the leads 62 and are themselves adhered to the inner surface of the retainer 72. In this manner, the leads 62 form loops that extend around the end 74 of the retainer 72.

As illustrated in FIG. 6, the structure 51 is positioned above the surface 69, and the ends of the loops of the leads 62 extend, in a free state, from the leadframe 52 by the distance D2 that is equal to or greater than the distance D1. As illustrated in FIG. 7, the structure 51 is mounted on the surface 69 such that the ends 76 of the spacers 70 abut against the surface 69.

The leads 62 are capable of resiliently deforming in such a manner as to conformably engage with the terminals 80 on the surface 69. The structure 51 is permanently attached to the surface 69 by soldering as described above.

The weight of the support member 70 is selected such that, in response to the total weight of the structure 51 and the resilience of the leads 62 and their formed shape, the leads 62 are capable of resiliently deforming as the structure 51 is lowered onto the surface 69, and the ends 74 of the spacers 70 abut against the surface 69.

The support member 64 protects the outer leads 62, and enables the structure 51 to be shipped without a carrier. The increased integrity that is imparted to the outer leads 62 by the support member 64 enables the structure 51 to be electronically tested after it has been received by an end user prior to mounting. Reworking after mounting is also possible due to the increased lead integrity.

Figure 10:
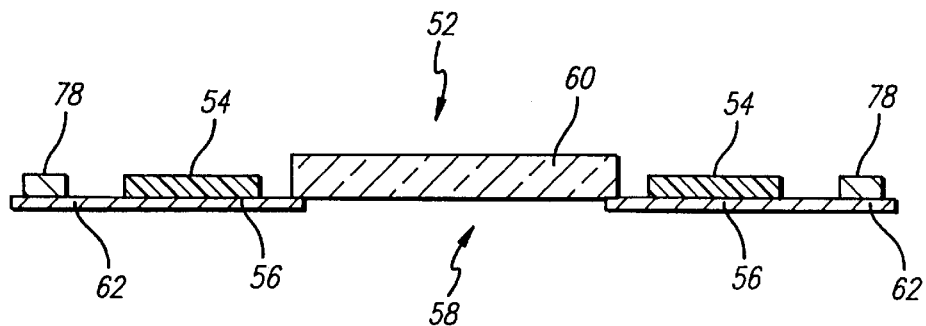
FIGS. 10 and 11 are sectional views illustrating a method of assembling the microelectronic circuit assembly of FIGS. 6 and 7.
Figure 11:
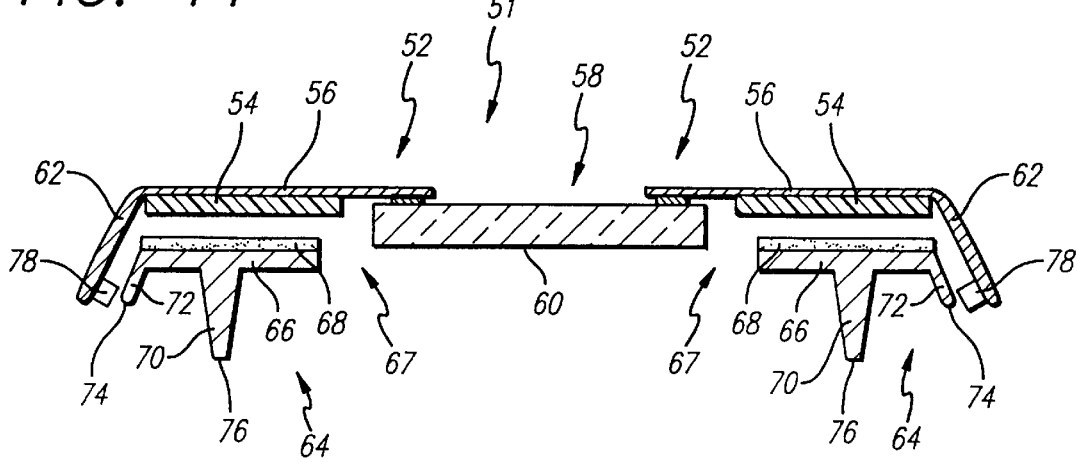

FIGS. 10 and 11 illustrate a method of fabricating the structure 51. In FIG. 10, the leadframe 52 and chip 60 are excised from the outer portion of the COT module, and the lead bars 78 are adhered to the leads 62. In FIG. 11, the adhesive 68 is applied to the base 66 of the support member 64 (and/or to the film 54 of the leadframe 52), and the leadframe 52 is adhered to the support member 64. The leads 62 are bent down and around the end 74 of the lead retainer 72, and the lead bar 78 is adhered to the lead retainer 72 to produce the structure 51 as illustrated in FIG. 6.

Figure 12:
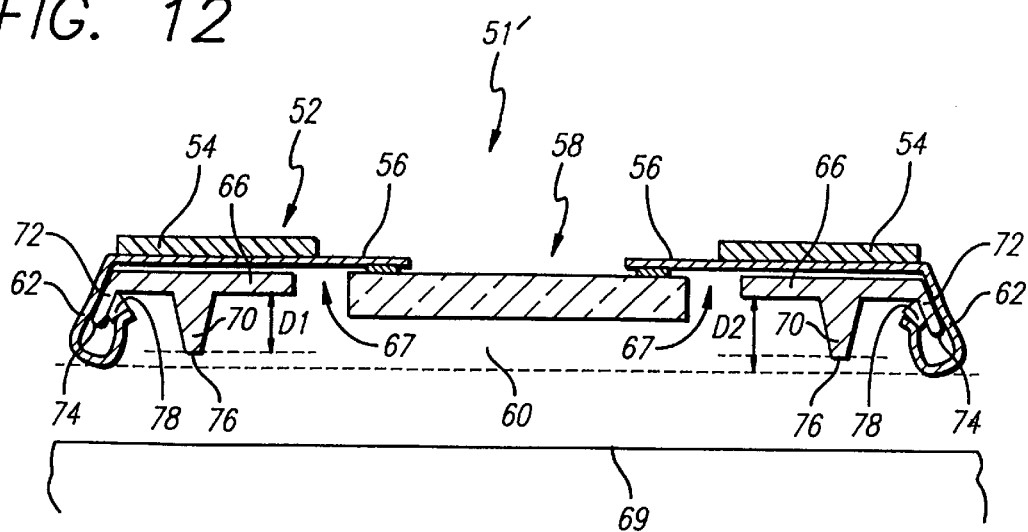
FIGS. 12 to 17 are sectional views illustrating alternative embodiments of the present microelectronic circuit structure.

In the structure 51 of FIG. 6, the leadframe 52 is mounted with the film 54 facing the support member 64. FIG. 12 illustrates a structure 51' which is similar to the structure 51 except that the leadframe 52 is mounted with the film 54 facing away from the support member 64 and the chip 60 facing the surface 69. The invention is not so limited, however, and encompasses mounting the chip 60 on the upper, rather than the lower surface of the leadframe 52.

Figure 13:
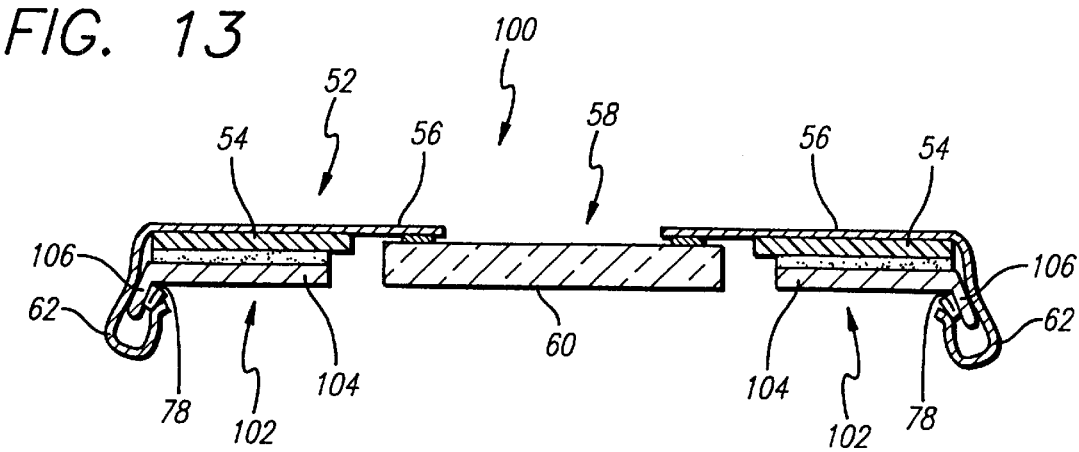

FIG. 13 illustrates another structure 100 embodying the present invention in which the functions of the spacers 70 and lead retainer 72 as illustrated in FIG. 6 are combined. The structure 100 comprises a support member 102 having a base 104, and a spacer 106 that has a shape similar to that of the lead retainer 72. The leads 62 are looped around the end of the spacer 106 and adhered to the laterally inner surface thereof by the lead bars 78 in the manner described above with reference to FIG. 6.

Figure 14:
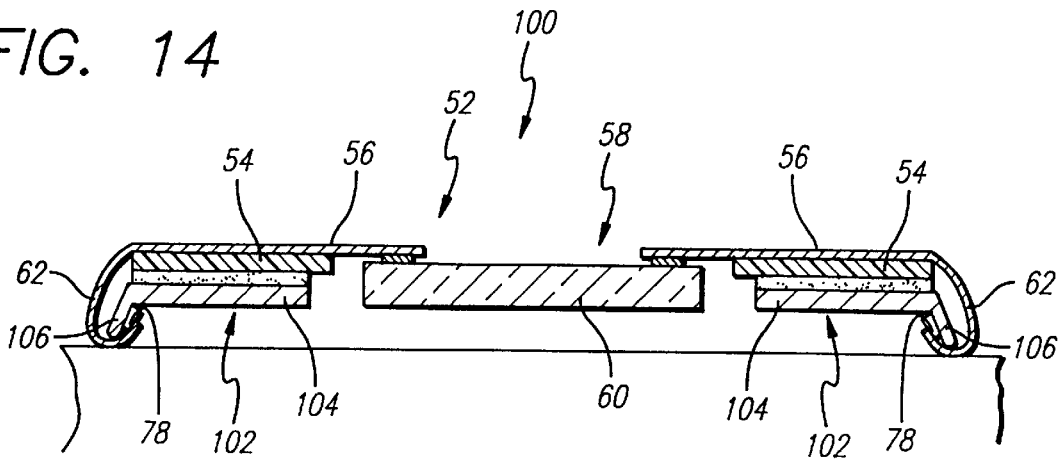

As the structure 100 settles onto the surface 69 due to its weight, the leads 62 resiliently bend into the shape illustrated in FIG. 14. At this point, the end of the support member 102 abuts against the surface 69 with the leads 62 pressed therebetween. The leads 62 are then soldered to terminals (not shown) on the surface 69 as described above.

Figure 15:
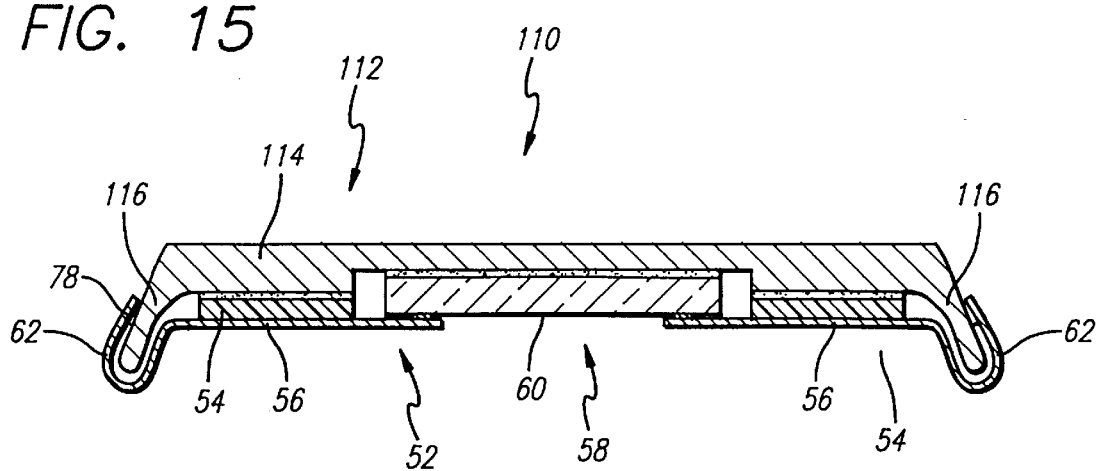

FIG. 15 illustrates another structure 110 embodying the present invention which combines the concepts of the heatspreader 84 of FIG. 4 with the combined spacer/lead retainer 106 of FIG. 13. The structure 110 comprises a heatspreader 112 including a base 114 and a spacer 116. The leads 62 are looped over the inner surface and end of the spacer 116, and adhered to the outer surface of the spacer 116 via the lead bar 78. The operation of mounting the structure 110 is the same as described with reference to FIG. 14.

Figure 16:
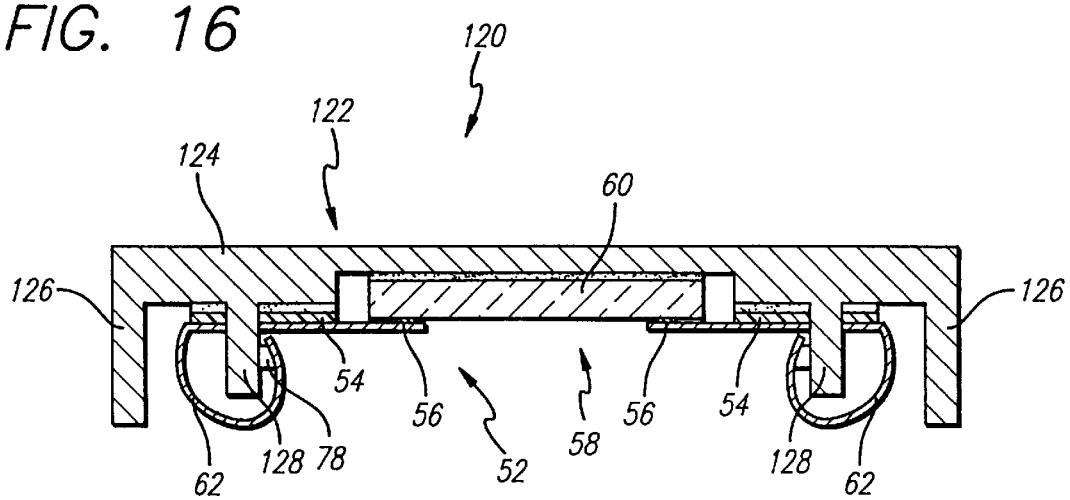

FIG. 16 illustrates a structure 120 comprising a heatspreader 122 in which the relative positions of the spacer and the lead retainer are reversed from the embodiments described above. More specifically, the heatspreader 122 comprises a base 124, a spacer 126 and a retainer 128 that is spaced laterally inward of the spacer 126. The leads 62 loop around the outer surface and the end of the retainer 128 and are adhered to the inner surface thereof.

Figure 17:
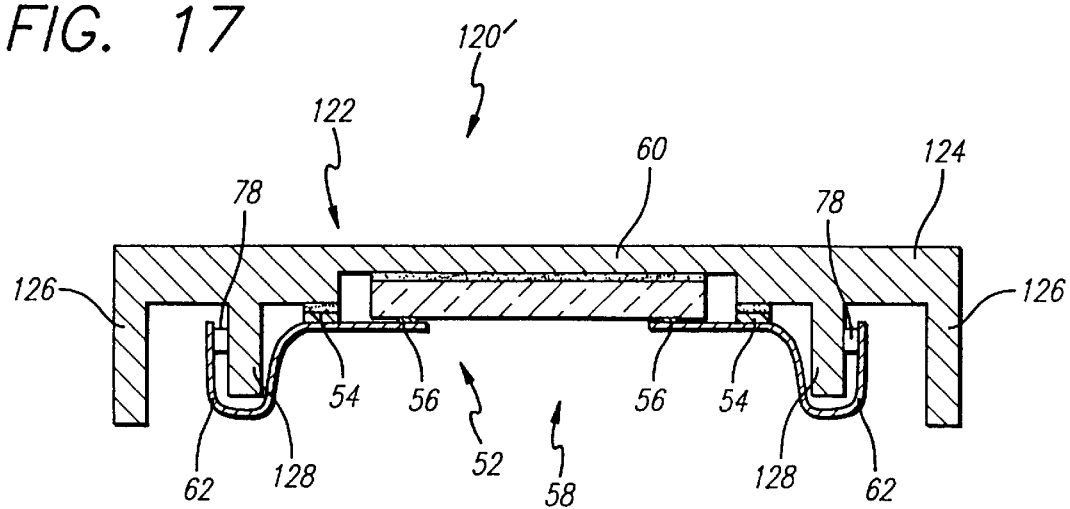

FIG. 17 illustrates a structure 120' that is similar to the structure 120 except that the leads 62 are looped around the inner surface and the end of the retainer 128 and are adhered to the outer surface thereof.

Various modifications will become possible for those skilled in the art after receiving the teachings of the present disclosure without departing from the scope thereof.

For example, the spacers and/or retainers can be provided in any suitable number and have any suitable shape. It is even within the scope of the invention to provide a support member comprising only one spacer in the form of a block, although not specifically illustrated.

I claim:

1. A method for mounting a microelectronic circuit package, including a microelectronic device and a leadframe having a plurality of leads protruding outwardly therefrom on a surface, comprising the steps of:
    (a) providing a support member including a base for supporting the package and a spacer that extends from the base for abutment against the surface to provide a predetermined spacing between the leadframe and the surface;
    (b) mounting the package on the base;
    (c) bending the leads such that they extend toward the surface as least as far as the spacer;
    (d) placing the support member and the package on the surface such that a combined weight of the package and the support member causes the leads to resiliently deform, the spacer to abut against the surface and the leads to conformably engage with the surface;
    wherein the support member further comprises a lead retainer that extends from the base toward the surface; and
    step (c) further comprises attaching end portions of the leads to the lead retainer such that the leads, in a free state, form loops that extend toward the surface beyond the spacer.

2. A method for mounting a microelectronic circuit package on a surface, said method comprising the steps of:
    (a) providing a microelectronic circuit package including a microelectronic device and a lead frame having a plurality of leads protruding outwardly from the device;
    (b) providing a support member including a base for supporting the package, and lead retainers;
    (c) mounting the package to the base;
    (d) attaching end portions of the leads to the lead retainer such that the leads, in a free state, form loops about the lead retainer, that extend toward the surface; and
    (e) placing the support member and the package on the surface, such that the loops resiliently and conformably engage with the surface.

3. The method of claim 2 wherein step (e) includes the loops resiliently and conformably engaging with terminals on the surface.

4. The method of claim 2 further comprising ohmically adhering the loops to conjugate electrical connection points on the surface.

5. The method of claim 2 wherein the support member includes a rigid spacer extending from the base and providing a predetermined spacing between the lead frame and the surface.

6. The method of claim 5 wherein the rigid spacer is perpendicular relative to the base.

7. The method of claim 5 wherein the lead retainers are disposed laterally inward of the rigid spacer.

8. The method of claim 5 wherein the lead retainers are disposed laterally outward of the rigid spacer.

9. The method of claim 5 wherein the lead retainers angle outwardly relative to the base.

10. The method of claim 2 wherein step (d) includes attaching a keeper bar to the end portion to the lead retainer.

11. The method of claim 2 further comprising soldering the loops to terminals on the surface.

12. The method of claim 2 wherein step (e) includes the combined weight of the package and the support member causing the loops to resiliently and conformably engage with the surface.

13. The method of claim 2 wherein the support member includes a rigid spacer, and the combined weight causes the spacer to abut against the surface.

14. The method of claim 2 wherein step (c) includes mounting the package underneath the base.

15. A method for mounting a microelectronic circuit package on a surface, said method comprising the steps of:
    (a) providing a microelectronic circuit package including a microelectronic device and a lead frame having a plurality of leads protruding outwardly from the device;
    (b) providing a support member including a base for supporting the package, and lead retainers;
    (c) mounting the package to the base;
    (d) attaching end portions of the leads such that the leads, in a free state, form loops about the lead retainer, that extend toward the surface; and
    (e) placing the support member and the package on the surface, such that the loops resiliently and conformably engage with the surface;
    wherein step (b) includes forming the support member such that the lead retainers angle outwardly relative to the base so that the lead retainers extend from the base toward the surface after step (e).

16. A method for mounting a microelectronic circuit package on a surface, said method comprising the steps of:
    (a) providing a microelectronic circuit package including a microelectronic device and a lead frame having a plurality of leads protruding outwardly from the device;
    (b) providing a support member including a base for supporting the package, and lead retainers;
    (c) mounting the package to the base;
    (d) attaching end portions of the leads such that the leads, in a free state, form loops about the lead retainer, that extend toward the surface; and
    (e) placing the support member and the package on the surface, such that the loops resiliently and conformably engage with the surface;
    wherein the lead retainers define rigid spacers providing a predetermined spacing between the lead frame and the surface.

17. A method for mounting a microelectronic circuit package on a surface, said method comprising the steps of:
    (a) providing a microelectronic circuit package including a microelectronic device and a lead frame having a plurality of leads protruding outwardly from the device;

(b) providing a support member including a base for supporting the package, and lead retainers;

(c) mounting the package to the base;

(d) attaching end portions of the leads such that the leads, in a free state, form loops about the lead retainer, that extend toward the surface; and (e) placing the support member and the package on the surface, such that the loops resiliently and conformably engage with the surface;

wherein the lead retainers angle outwardly relative to the base.

18. The method of claim 17 wherein the lead retainer has its outboard surface projecting laterally outward relative to the base.

19. A method for mounting a microelectronic circuit package on a surface, said method comprising the steps of:

(a) providing a microelectronic circuit package including a microelectronic device and a lead frame having a plurality of leads protruding outwardly from the device;

(b) providing a support member including a base for supporting the package, and lead retainers;

(c) mounting the package to the base;

(d) attaching end portions of the leads such that the leads, in a free state, form loops about the lead retainer, that extend toward the surface; and (e) placing the support member and the package on the surface, such that the loops resiliently and conformably engage with the surface;

wherein step (d) includes attaching a keeper bar attached to the end portions to the lead retainer.

20. The method of claim 19 wherein the lead retainers angle outwardly relative to the base.

21. The method of claim 19 wherein the support member includes a rigid spacer extending from the base and providing a predetermined spacing between the lead frame and the surface.

22. A method for mounting a microelectronic circuit package on a surface, said method comprising the steps of:

(a) providing a microelectronic circuit package including a microelectronic device and a lead frame having a plurality of leads protruding outwardly from the device;

(b) providing a support member including a base for supporting the package, and lead retainers;

(c) mounting the package to the base;

(d) attaching end portions of the leads such that the leads, in a free state, form loops about the lead retainer, that extend toward the surface;

(e) placing the support member and the package on the surface, such that the loops resiliently and conformably engage with the surface; and (f) soldering the loops to terminals on the surface.

23. A method for mounting a microelectronic circuit package on a surface, said method comprising the steps of:

(a) providing a microelectronic circuit package including a microelectronic device and a lead frame having a plurality of leads protruding outwardly from the device;

(b) providing a support member including a base for supporting the package, and lead retainers;

(c) mounting the package to the base;

(d) attaching end portions of the leads such that the leads, in a free state, form loops about the lead retainer, that extend toward the surface; and (e) placing the support member and the package on the surface, such that the loops resiliently and conformably engage with the surface;

wherein step (e) includes a combined weight of the package and the support member causing the loops to resiliently and conformable engage with the surface.

24. The method of claim 23 wherein the support member includes a rigid spacer extending from the base providing a predetermined spacing between the lead frame and the surface.

25. The method of claim 24 wherein the lead retainers are disposed laterally inward of the spacer.

26. The method of claim 24 wherein the lead retainers are disposed laterally outward of the spacer.

27. The method of claim 23 wherein step (c) includes mounting the package underneath the base.

28. A method of mounting a microelectronic circuit package, including a microelectronic device and a lead frame having a plurality of leads protruding outwardly therefrom, on a surface, comprising the steps of:

(a) providing a support member including a base for supporting the package and a spacer that extends from the base for abutment against the surface to provide a predetermined spacing between the lead frame and the surface;

(b) mounting the package on the base;

(c) bending the leads such that they extend toward the surface as least as far as the spacer; and (d) placing the support member and the package on the surface such that a combined weight of the package and the support member causes the leads to resiliently deform, the spacer to abut against the surface and the leads to conformably engage with the surface;

wherein step (c) further comprises the subsets of:

(e) attaching a keeper bar to the end portions of the leads; and (f) attaching the keeper bar to a lead retainer.

29. The method of claim 28 wherein the lead retainer extends from the base towards the surface.

* * * * *